US009689067B2

United States Patent
Saitoh et al.

(10) Patent No.: US 9,689,067 B2
(45) Date of Patent: Jun. 27, 2017

(54) METHOD FOR PRODUCING MOLYBDENUM TARGET

(75) Inventors: Kazuya Saitoh, Yasugi (JP); Tomoyuki Hata, Yasugi (JP); Masashi Kaminada, Yasugi (JP); Hiroshi Takashima, Yasugi (JP)

(73) Assignee: HITACHI METALS, LTD., Tokyo (JP)

( * ) Notice: Subject to any disclaimer, the term of this patent is extended or adjusted under 35 U.S.C. 154(b) by 582 days.

(21) Appl. No.: 13/825,706

(22) PCT Filed: Sep. 14, 2011

(86) PCT No.: PCT/JP2011/070943
§ 371 (c)(1),
(2), (4) Date: Mar. 22, 2013

(87) PCT Pub. No.: WO2012/043227
PCT Pub. Date: Apr. 5, 2012

(65) Prior Publication Data
US 2013/0189145 A1    Jul. 25, 2013

(30) Foreign Application Priority Data

Sep. 30, 2010   (JP) ................. 2010-220533

(51) Int. Cl.
*C23C 14/34*    (2006.01)
*C23C 14/14*    (2006.01)
(Continued)

(52) U.S. Cl.
CPC ............... *C23C 14/14* (2013.01); *B22F 3/14* (2013.01); *C23C 14/3414* (2013.01); *B22F 2998/10* (2013.01); *C22C 1/045* (2013.01)

(58) Field of Classification Search
CPC ........ C23C 14/3414; B22F 3/14; C22C 1/045
(Continued)

(56) References Cited

U.S. PATENT DOCUMENTS 2,454,322 A * 11/1948 Iredell et al. ................... 75/623
7,534,282 B2 * 5/2009 Ibaraki ................... C22C 1/045
                                                          75/246

(Continued)

FOREIGN PATENT DOCUMENTS

CN        1607054 A     4/2005
CN        1660526 A     8/2005
(Continued)

OTHER PUBLICATIONS

German, R. M. "Prediction of Sintered Density for Bimodal Powder Mixtures." Metallurgical Transactions A MTA 23.5 (1992): 1455-465. Springer Link. Web. Jul. 2, 2015.*

*Primary Examiner* — Jessee Roe
*Assistant Examiner* — Jeremy Jones
(74) *Attorney, Agent, or Firm* — Sughrue Mion, PLLC

(57) ABSTRACT

Provided is a method by which a low-oxygen and high-density molybdenum target can be efficiently obtained, while fully utilizing the characteristics of each molybdenum (Mo) starting material powder. The present invention provides a method for producing a molybdenum target, wherein a mixed powder that is obtained by mixing a molybdenum powder A, which is prepared by reducing molybdenum oxide and then crushing the resulting so as to have an average particle diameter of 2-15 μm, and a molybdenum powder B, which is prepared by crushing a molybdenum bulk starting material having a density of not less than $6.64 \times 10$ (kg/m$^3$) so as to have an average particle diameter of 50-2,000 μm, is sintered under pressure.

2 Claims, 2 Drawing Sheets

25μm

(51) Int. Cl.
*B22F 3/14* (2006.01)
*C22C 1/04* (2006.01)

(58) Field of Classification Search
USPC .......................................................... 419/31
See application file for complete search history.

(56) References Cited

U.S. PATENT DOCUMENTS

| | | |
|---|---|---|
| 2005/0061106 A1 | 3/2005 | Ibaraki et al. |
| 2005/0191202 A1 | 9/2005 | Iwasaki et al. |
| 2006/0042728 A1* | 3/2006 | Lemon .................... B22F 3/162 |
| | | 148/668 |
| 2006/0257279 A1 | 11/2006 | Ishijima et al. |
| 2008/0171215 A1* | 7/2008 | Kumar ................. B22F 3/1017 |
| | | 428/546 |

FOREIGN PATENT DOCUMENTS

| | | |
|---|---|---|
| JP | 5-9509 A | 1/1993 |
| JP | 11-36006 A | 2/1999 |
| JP | 2003-64473 A | 3/2003 |
| JP | 2005-133197 A | 5/2005 |
| JP | 2006-193826 A | 7/2006 |
| JP | 2006-344581 A | 12/2006 |
| JP | 2008-163467 A | 7/2008 |
| JP | 2008163467 A * | 7/2008 |

* cited by examiner

25μm

25μm

25μm

25μm

25μm

METHOD FOR PRODUCING MOLYBDENUM TARGET

CROSS REFERENCE TO RELATED APPLICATIONS

This application is a National Stage of International Application No. PCT/JP2011/070943 filed Sep. 14, 2011, the contents of which are incorporated herein by reference in their entirety.

TECHNICAL FIELD

The present invention relates to a method for producing a molybdenum target for use in a physical vapor deposition technique such as sputtering.

BACKGROUND ART

At present, a thin film of a high-melting point metal such as molybdenum (hereafter, Mo) which has low electrical resistance is being used in a thin film electrode and thin film wiring etc. of a flat-panel display such as a Liquid Crystal Display, and a target material for sputtering is widely used as a material for forming the metal thin film.

In producing a Mo bulk body such as a target material, a method of sintering Mo raw material powder to form a bulk body is generally adopted because Mo is a high-melting point metal and therefore it is difficult to produce the Mo bulk body by a melting and casting method. As one such method, a method in which Mo raw material powder obtained by reduction-treating Mo oxide is compression-molded, is sintered in a reducing atmosphere, and is further subjected to plastic working to increase the density thereof is adopted. On the other hand, a method in which Mo raw material powder obtained by reduction treatment is adjusted to have a constant particle size, is packed into a pressure vessel, and thereafter is subjected to a pressure sintering process to obtain a high-density sintered body.

Moreover, since Mo powder with high-purity, typically with a purity of not less than 99.9% (3N) is produced by reduction treatment of Mo oxide ($MoO_3$) powder, the Mo powder is usually fine powder having a particle size of not more than 15 µm in which minute primary particles are aggregated. Therefore, a specific surface area per unit volume is large, a sufficient packing density is not achieved even if being packed in a vessel etc., and also, a non-uniform packing state is caused in the vessel, so that there has been a problem that deformation such as warpage of the sintered body is likely to occur during the pressure sintering.

In contrast to this, the present applicant has proposed a technique in which fine Mo raw material powder is once compression-molded and thereafter crushed to produce a secondary powder having a large particle diameter, and then the secondary powder is packed into a pressure vessel so as to be pressure-sintered, as a method for producing a Mo target in which deformation during sintering is prevented. This method utilizes an advantage that the secondary powder having a large particle diameter is excellent in the packing property (JP-A-2008-163467, Patent Literature 1).

Further, there is also disclosed a method in which the Mo raw material powder is made to be coarse particles by reduction-treating Mo oxide to which a specific amount of potassium is added. This method uses Mo raw material powder which is made to be particles coarser than those in typical Mo powder obtained by reduction-treating Mo oxide, and thereby proposes to increase the sintered density when the Mo raw material powder is sintered (JP-A-2005-133197, Patent Literature 2).

Further, the present applicant has proposed a method in which a bulk body of a high-melting point metal such as Mo is cut out to obtain machining chips (turning chips), and the machining chips are subjected to crushing processing and reduction treatment to form low-oxygen Mo powder, as a method for producing Mo powder (JP-A-2006-193826, Patent Literature 3).

CITATION LIST

Patent Literature

Patent Literature 1: JP-A-2008-163467
Patent Literature 2: JP-A-2005-133197
Patent Literature 3: JP-A-2006-193826

SUMMARY OF INVENTION

Technical Problem

The methods shown in Patent Literature 1 and Patent Literature 2 are very effective as a technique to produce a sintered target of Mo from a Mo powder raw material which is produced by reduction-treating normal Mo oxide powder. However, since the Mo powder raw material produced by reduction from the oxide Mo powder uses fine Mo oxide powder as a starting raw material, there is a limit by nature to reduction of the oxygen content even if carrying out reduction treatment. Moreover, owing to the feature that the Mo powder raw material is fine powder, there is a problem that the oxygen content per unit volume tends to increase. The problem of an excess amount of oxygen content will become an obstacle in reducing the oxygen content in the pressure sintering process in which sintering is carried out in an enclosed space.

Moreover, when the Mo powder produced by crushing from a bulk body as shown in Patent Literature 3 is used, there is an advantage that the packing property into a space of pressure sintering processing is improved by controlling the particle diameter of the Mo powder to be large. However, there may be a case where it is difficult to increase the sintered density due to the reason that the Mo powder produced by crushing has a larger particle diameter, and therefore the occurrence frequency of triple-point pores of powder increases.

Furthermore, a Mo target is required to possibly reduce its oxygen content which affects the electrical resistance of the metal thin film, and to have a high density as much as possible to suppress the occurrence of arcing etc. during sputtering.

An object of the present invention is to provide a producing method which allows a low-oxygen and high-density Mo target to be effectively produced.

Solution to Problem

The present inventor has found that it becomes possible to achieve a high packing density and suppress deformation of a sintered body during pressure sintering, and at the same time, to achieve reduction of oxygen content and increase of the density of the Mo sintered body by mixing powder obtained by reducing and then disintegrating Mo oxide and Mo powder produced from a bulk body with a specific or higher density, and has realized the present invention.

That is, the present invention is a method for producing a Mo target, comprising: preparing mixed powder by mixing Mo powder A and Mo powder B, wherein the Mo powder A is obtained by reducing and then disintegrating Mo oxide so as to adjust the average particle diameter of the Mo powder A to be 2 to 15 µm, and the Mo powder B is obtained by crushing a Mo bulk body having a density of not less than $6.64 \times 10^3$ kg/m$^3$ as a raw material so as to adjust the average particle diameter of the Mo powder B to be 50 to 2000 µm; and pressure-sintering the mixed powder.

In the present invention, the mixed powder is preferably mixed so as to have a mass percentage of the Mo powder A ranging from 10% to 90%, where the mass percentage is represented by (A/(A+B))×100.

Further, in the present invention, the mixed powder may be packed into a pressure vessel and thereafter pressure-sintered.

Further, in the present invention, the pressure-sintering is preferably performed at a sintering temperature of 1000° C. to 1800° C. and a pressure of 10 to 200 MPa for 1 to 10 hours.

Advantageous Effects of Invention

According to the present invention, since it is possible to provide a reasonable producing process which can realize both of reduction of oxygen content and increase of density as a powder sintered target, the industrial value of the present invention is very high.

DESCRIPTION OF EMBODIMENTS

Figure 1:
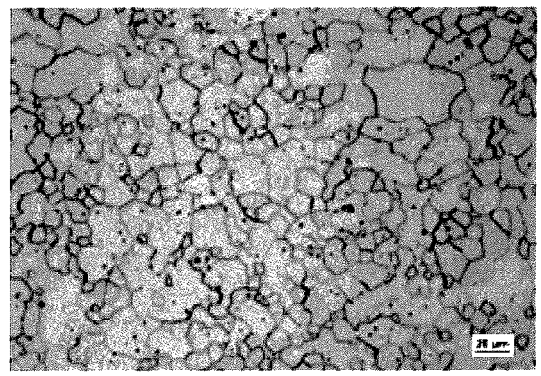
FIG. 1 is an optical microphotograph of a sintered body of Evaluation No. 8 of the present invention.
Figure 2:
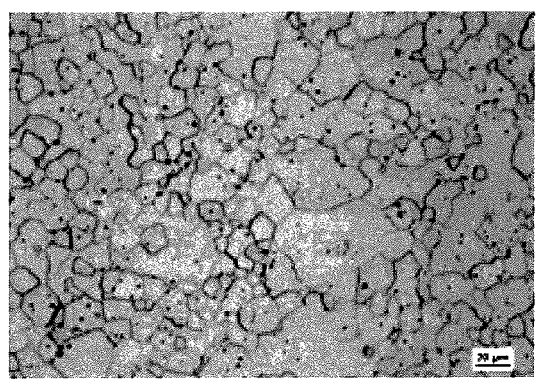
FIG. 2 is an optical microphotograph of a sintered body of Evaluation No. 6 of the present invention.
Figure 3:
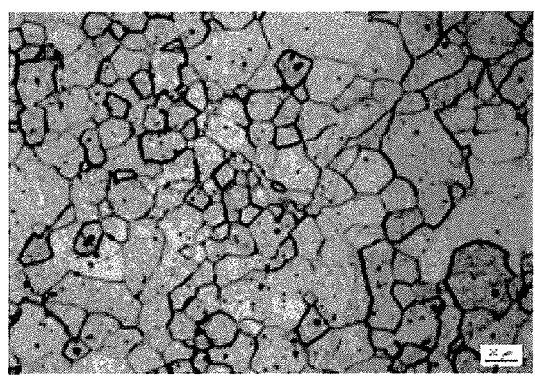
FIG. 3 is an optical microphotograph of a sintered body of Evaluation No. 9 of the present invention.
Figure 4:
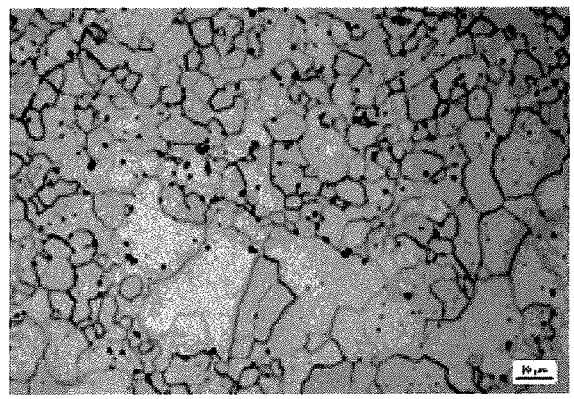
FIG. 4 is an optical microphotograph of a sintered body of Evaluation No. 22 of the present invention.

As described above, an essential feature of the present invention lies in finding that mixing of Mo powder produced from a bulk body having a specific or higher density and powder obtained by reducing and then disintegrating Mo oxide under a predetermined condition makes it possible to obtain a high packing density, thereby achieving reduction of oxygen content and increase in density of the Mo sintered body at the same time. Detailed description thereof will be given below.

In the Mo powder proposed in Patent Literature 3, which is produced from a Mo bulk body, since the powder is to be obtained from a bulk body through mechanical operation, the smaller the particle diameter of the powder to be made, the higher the cost. Moreover, the Mo powder proposed in Patent Literature 3 has a problem that as the particle diameter of the powder is intended to be smaller, the oxidation will proceed excessively during production, which makes it difficult to obtain a low-oxygen Mo sintered body. Thus, decreasing the particle diameter of the Mo powder will increase the specific surface area per unit volume, thereby also leading to increase in amount of oxygen which adsorbs to the powder surface.

On the other hand, as described in Patent Literatures 1 and 2, when high purity Mo powder which can be used as a raw material for the target is to be obtained, it is necessary to obtain the high-purity Mo powder by reducing Mo oxide which has been chemically refined. In this case, there is a problem that since the chemically refined Mo oxide is used as a starting raw material, it is difficult by nature to increase the particle diameter of the powder, and increasing the particle diameter will make the reduction treatment thereof difficult.

That is, seen from the viewpoint of lower oxygen, it is effective that the Mo powder produced from a bulk body is used with a somewhat larger particle diameter. On the other hand, in the case of high-purity Mo raw material powder obtained by reducing normal Mo oxide which has been chemically refined, since increasing the particle diameter is difficult, it is effective that the high-purity Mo raw material powder is used still in fine state as much as possible.

When a large diameter particle and a small diameter particle are mixed, it is possible to increase the packing density owing to the geometric form thereof. The important point is that this relationship holds true for the relationship between the above described Mo powder of a large diameter particle and a low-oxygen level, which is produced from a bulk body, and the high-purity Mo powder of a small diameter particle and a rather high oxygen level, which is obtained by reducing normal, chemically refined Mo oxide, so that it is possible to increase the packing density by mixing and at the same time to reduce the oxygen level in the state of a mixed powder.

Thus, the present invention can establish a reasonable producing process of a low-oxygen and high-purity Mo target by combining these powders and controlling them under a predetermined condition.

In the present invention, Mo oxide is first reduced, and then is disintegrated by mechanical means or the like to prepare Mo powder A of which the average particle diameter is made 2 to 15 µm. Here, a normal adjustment process of chemically refined high-purity Mo powder can be applied thereto. The reason why Mo oxide is disintegrated is that the reduction treatment of Mo oxide results in an aggregated form in which fine Mo primary particles are connected in a network shape, making it difficult to increase the packing density as it is.

Moreover, the reason why the average particle diameter is adjusted to be 2 to 15 µm is that in the case of fine powder having a particle diameter of less than 2 µm, it is not possible to increase the sintered density thereof, and besides the amount of oxygen which adsorbs to the surface increases so that the reduction of oxygen level is impaired. On the other hand, it is not easy to obtain Mo particles having a diameter of more than 15 µm from Mo oxide. Therefore, in the present invention, the average particle diameter of the Mo powder A is adjusted to be 2 to 15 µm.

Moreover, in the present invention, it is preferable to adjust the amount of oxygen in the Mo powder A to be 100 to 900 ppm by mass by performing reduction treatment to obtain a low-oxygen Mo target.

Further, in the present invention, the Mo powder B in which the average diameter is adjusted to be 50 to 2000 µm by crushing is prepared from a raw material of a Mo bulk body having a density of not less than $6.64 \times 10^3$ kg/m$^3$. The Mo powder B obtained by crushing a bulk body as a raw material is fine powder itself, and therefore contributes to increase in packing density. For this reason, as the Mo bulk body, one having a density of not less than $6.64 \times 10^3$ kg/m$^3$, which is not less than a relative density 65% with respect to a true density of $10.22×10^3$ kg/m$^3$ of pure Mo is used.

When the average particle diameter of the Mo powder B is attempted to be decreased to be less than 50 μm, the cost will remarkably increases and oxidation of the powder will proceeds excessively at the time of production. Moreover, there is also a problem that the difference in average particle diameter from that of the Mo powder A becomes smaller, and it becomes difficult to increase the packing density of the mixed powder.

On the other hand, when the average particle diameter of the Mo powder B exceeds 2000 μm, the occurrence frequency of triple-point pores of powder increases, and thereby it becomes difficult to achieve a high density. Moreover, when the difference in particle diameter between the Mo powder A and the Mo powder B widens, unevenness becomes likely to occur in a sintered body structure, and uniform sputtering as a target becomes less likely to proceed. Therefore, in the present invention, the average particle diameter of the Mo powder B is adjusted to be 50 to 2000 μm. Moreover, in order to remove particles which have inappropriately large particle diameters as the Mo powder B, it is preferably not more than 500 μm.

Note that the Mo powder B is preferably subjected to reduction treatment after being obtained by crushing a Mo bulk body as a raw material. This is because reducing an oxide layer produced on the surface of crushed powder makes the sintering with mixed powder easy, and allows reduction in amount of oxygen in the entire powder B. As realistic reduction treatment, holding at a temperature of 500° C. to 1300° C. for not less than 1 hour in a hydrogen gas stream is preferable.

Moreover, in the present invention, it is possible to make the amount of oxygen of the Mo powder B, which is obtained by crushing a Mo bulk body, 50 to 300 ppm by mass by performing reduction treatment to obtain a low-oxygen Mo target.

In the present invention, a mixed powder in which Mo powder A and Mo powder B are mixed is pressure-sintered to obtain a Mo target.

Note that when the Mo powder A alone is used, packing density will not increase, and when the Mo powder A and the Mo powder B are mixed, the packing density will increase. The Mo powder A and the Mo powder B in the present invention are preferably mixed such that the mixing ratio is 10% to 90% where the mass percentage of the Mo powder A is represented by (A/(A+B))×100 (hereafter, simply referred to as a "mixing ratio"). When the mixing ratio is less than 10%, that is, the amount of the Mo powder B is larger than that of the Mo powder A, it is possible to increase the packing density of the mixed powder; however, there is a risk that the presence of a large amount of the Mo powder B of a large diameter particle will cause increase in occurrence frequency of triple-point pores of powder, thereby inducing structural defects such as a relatively large pore which is harmful when forming a sintered body.

On the other hand, when the mixing ratio exceeds 90%, there may be a case where the packing factor of the powder is not sufficiently increased, and deformation of the sintered body becomes more likely to occur during pressure sintering. Moreover, increase of the Mo powder A having a smaller diameter leads to increase of the powder surface area per unit volume so that the oxygen value of the sintered body becomes more likely to increase.

In the present invention, more preferable mixing ratio is 20% to 70% when taking into consideration of increasing the density and reducing the oxygen level of a sintered body obtained by pressure sintering.

In the present invention, the mixed powder can be packed in a pressure vessel, and thereafter be pressure-sintered.

Packing into a pressure vessel is a technique which is applied when, for example, pressure sintering is carried out by a hot isostatic press. The packing property into a pressure vessel affects the deformation of a sintered body. Since the present invention can increase the packing density, application of a pressure vessel is effective.

Moreover, the present invention is effective in the point that a high packing property makes it easy to achieve a high density even when pressure sintering such as hot press, which does not use a pressure vessel, is performed.

In the present invention, a realistic sintering condition may be a sintering temperature of 1000° C. to 1800° C., a pressure of 10 to 200 MPa, and a holding time of 1 to 10 hours.

Selectable ranges of these conditions generally differ depending on the pressure sintering facility to be used. For example, it is easy to apply a low temperature and high pressure condition in a hot isostatic press, and a high-temperature and low pressure condition in a hot press.

Note that when the sintering temperature is less than 1000° C., sintering is hard to proceed, and therefore such temperature is not realistic. On the other hand, when the sintering temperature exceeds 1800° C., the availability of an apparatus which can withstand such condition is limited, and besides the crystal growth in the structure of the sintered body becomes remarkable so that there may be a case where obtaining a uniform and fine structure is difficult.

Further, at a pressure less than 10 MPa, sintering is hard to proceed, and therefore such pressure is not realistic. On the other hand, when pressure exceeds 200 MPa, there is a problem that the availability of an apparatus which can withstand such pressure is limited.

Moreover, in case that a sintering time is less than 1 hour, it is difficult to proceed with sintering sufficiently. On the other hand, a sintering time exceeding 10 hours should be avoided in the viewpoint of producing efficiency.

Note that when pressure sintering is carried out by a hot press or a hot isostatic press, the mixed powder is preferably vacuum degassed while being heated after it is packed in a pressurizing die or a pressure vessel. The vacuum degassing is preferably carried out such that degassing is performed at a heating temperature range of 100° C. to 600° C., and under a pressure lower than the atmosphere (101.3 kPa). That is because it becomes possible to reduce the oxygen level in the resultant Mo sintered body to not more than 300 ppm by mass.

EXAMPLES

Experimental Example 1

A commercially available Mo powder having a purity of 3N, which is produced by reducing chemically refined Mo oxide ($MoO_3$) powder, was purchased, and the powder was subjected to disintegration processing to obtain Mo powders A having average diameters of 5, 7, and 9 μm as shown in Table 1.

Next, a Mo bulk body having a purity of 3N (a density of $10.16×10^3$ kg/m$^3$) was cut out to obtain machining chips. The machining chips were crushed into powder, and then reduction treatment of the powder surface was carried out by heat treatment, in which the powder was held at a temperature of 1200° C. for 2 hours in a hydrogen gas stream, to obtain Mo powders B in which the average particle diameters were adjusted to be predetermined values shown in Table 1.

The Mo powders A and the Mo powders B obtained as described above were mixed with the mixing ratio being fixed at 60%, and a tap density of each of them was measured to evaluate a packing property thereof. The results thereof are shown in Table 1. Note that hereafter the mixing ratio is the value of (A/(A+B))×100 based on the mass percentages of the Mo powders A and B.

TABLE 1

| Evaluation No. | Average particle diameter of powder A (μm) | Average particle diameter of powder B (μm) | Mixing ratio (%) | Tap density × 10³ (kg/m³) |
|---|---|---|---|---|
| 1 | 9 | 47 | 60 | 5.28 |
| 2 | 9 | 98 | 60 | 5.56 |
| 3 | 9 | 154 | 60 | 5.63 |
| 4 | 9 | 218 | 60 | 5.80 |
| 5 | 9 | 281 | 60 | 5.87 |
| 6 | 7 | 98 | 60 | 5.22 |
| 7 | 7 | 218 | 60 | 5.42 |
| 8 | 5 | 98 | 60 | 5.40 |
| 9 | 5 | 218 | 60 | 5.49 |

As shown in Table 1, it is seen that as the average particle diameter of the Mo powder B increases within the range of the present invention, the tap density increases while keeping a large value. Therefore, it can be confirmed that regarding the particle diameter of the Mo powder B, the present invention is effective within the range shown in Table 1 to improve the packing density of the mixed powder.

Next, measurements of tap densities were made when varying the mixing ratio of the Mo powders A and having average particle diameters of 5, 7, and 9 μm and the Mo powders B having average particle diameters of 98 and 218 μm obtained as described above, respectively. Table 2 shows the results when the Mo powder B having an average particle diameter of 98 μm was used, Table 3 shows those when the Mo powder B having an average particle diameter of 218 μm was used.

TABLE 2

| Evaluation No. | Average particle diameter of powder A (μm) | Average particle diameter of powder B (μm) | Mixing ratio (%) | Tap density × 10³ (kg/m³) | Remarks |
|---|---|---|---|---|---|
| 11 | 9 | — | 100 | 4.76 | Comparative Example |
| 12 | 9 | 98 | 60 | 5.56 | Same as No. 2 |
| 13 | 9 | 98 | 40 | 6.04 | |
| 14 | 9 | 98 | 30 | 6.12 | |
| 15 | 9 | 98 | 20 | 6.09 | |
| 16 | 9 | 98 | 10 | 5.86 | |
| 17 | — | 98 | 0 | 5.39 | Comparative Example |
| 18 | 7 | — | 100 | 4.43 | Comparative Example |
| 19 | 7 | 98 | 60 | 5.22 | Same as No. 6 |
| 41 | 7 | 98 | 40 | 5.81 | |
| 42 | 7 | 98 | 30 | 6.12 | |
| 43 | 7 | 98 | 20 | 6.11 | |
| 44 | 7 | 98 | 10 | 5.88 | |
| 45 | 5 | — | 100 | 4.39 | Comparative Example |
| 46 | 5 | 98 | 60 | 5.40 | Same as No. 8 |
| 47 | 5 | 98 | 40 | 5.89 | |
| 48 | 5 | 98 | 30 | 6.20 | |
| 49 | 5 | 98 | 20 | 6.14 | |
| 50 | 5 | 98 | 10 | 5.96 | |

TABLE 3

| Evaluation No. | Average particle diameter of powder A (μm) | Average particle diameter of powder B (μm) | Mixing ratio (%) | Tap density × 10³ (kg/m³) | Remarks |
|---|---|---|---|---|---|
| 21 | 9 | — | 100 | 4.76 | Comparative Example |
| 22 | 9 | 218 | 60 | 5.80 | Same as No. 4 |
| 23 | 9 | 218 | 40 | 6.36 | |
| 24 | 9 | 218 | 30 | 6.58 | |
| 25 | 9 | 218 | 20 | 6.45 | |
| 26 | 9 | 218 | 10 | 6.07 | |
| 27 | — | 218 | 0 | 5.48 | Comparative Example |
| 28 | 7 | — | 100 | 4.43 | Comparative Example |
| 29 | 7 | 218 | 60 | 5.42 | Same as No. 7 |
| 51 | 7 | 218 | 40 | 6.17 | |
| 52 | 7 | 218 | 30 | 6.48 | |
| 53 | 7 | 218 | 20 | 6.39 | |
| 54 | 7 | 218 | 10 | 5.94 | |
| 55 | 5 | — | 100 | 4.39 | Comparative Example |
| 56 | 5 | 218 | 60 | 5.49 | Same as No. 9 |
| 57 | 5 | 218 | 40 | 6.18 | |
| 58 | 5 | 218 | 30 | 6.58 | |
| 59 | 5 | 218 | 20 | 6.41 | |
| 60 | 5 | 218 | 10 | 6.01 | |

As shown in Tables 2 and 3, it is seen that mixed powders, in which respective Mo powder A and Mo powder B were mixed, exhibited significant increases in tap density compared with the case of the Mo powder A alone, meaning that the packing density can be increased.

Next, evaluations of sintered bodies were conducted. First, the mixed powders obtained by Evaluations No. 2, and Nos. 4 to 9 in Table 1 were packed into cans for a hot isostatic press that work as pressure vessels. Each can was vacuum degassed to $1\times10^{-3}$ Pa while being heated at 450° C., and was sealed. Thereafter, pressure sintering was conducted at a sintering temperature (maximum temperature) of 1250° C. and a maximum sintering pressure of 147 MPa for a holding time of 5 hours at the sintering temperature to obtain a sintered body. In order to evaluate the quality of each resultant sintered body as a target, oxygen analysis was conducted by using an oxygen analyzer (Model No: EMGA-620) manufactured by HORIBA, Ltd. Moreover, the measurements of density and purity were conducted. The measured results are shown in Table 4.

powders A and B, where (A/(A+B))×100 by mass % was 60%, were measured and shown in Table 5.

TABLE 4

| Evaluation No. | Average particle diameter of powder A (μm) | Average particle diameter of powder B (μm) | Mixing ratio (%) | Amount of oxygen in mixed powder (ppm by mass) | Amount of oxygen in sintered body (ppm by mass) | Sintered body density × 10³ (kg/m³) | Purity (%) | Remarks |
|---|---|---|---|---|---|---|---|---|
| 11 | 9 | — | 100 | 562 | 235 | 10.131 | >99.95 | Comparative Example |
| 17 | — | 98 | 0 | 87 | 103 | 10.134 | >99.95 | Comparative Example |
| 27 | — | 218 | 0 | 58 | 85 | 10.165 | >99.95 | Comparative Example |
| 12 | 9 | 98 | 60 | 322 | 224 | 10.175 | >99.95 | Same as No. 2 |
| 22 | 9 | 218 | 60 | 387 | 146 | 10.182 | >99.95 | Same as No. 4 |
| 5 | 9 | 281 | 60 | 355 | 265 | 10.179 | >99.95 | |
| 6 | 7 | 98 | 60 | 381 | 214 | 10.181 | >99.95 | |
| 7 | 7 | 218 | 60 | 386 | 146 | 10.183 | >99.95 | |
| 8 | 5 | 98 | 60 | 410 | 152 | 10.185 | >99.95 | |
| 9 | 5 | 218 | 60 | 366 | 147 | 10.184 | >99.95 | |

As shown in Table 4, the sintered body for a target of the present invention, which was obtained by pressure sintering each mixed powder in which Mo powder A and Mo powder B were mixed, achieved a high density compared with a sintered body of Evaluation No. 11 which was obtained by pressure sintering Mo powder A alone, while maintaining a high purity. Moreover, it is seen that the amount of oxygen in mixed powder was able to be reduced in the present example. This will allow the amount of oxygen in a sintered body to be reduced by vacuum degassing in a shorter time, thereby enabling an effective oxygen reduction.

Figure 5:
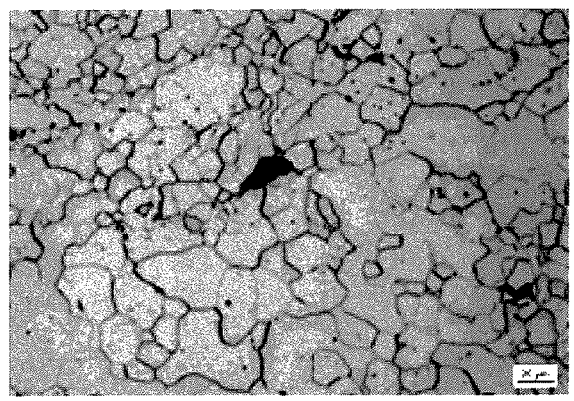
FIG. 5 is an optical microphotograph of a sintered body of Evaluation No. 27 of the comparative example.

Each of the sintered bodies of Evaluation Nos. 6, 8, 9, 22, and 27 was subjected to microstructure observation by using an optical microscope (Inverted Metallurgical Microscope ECLIPSE MA200 manufactured by Nikon Corporation). Microstructure photographs of sintered bodies of Evaluation Nos. 6, 8, 9, and 22 of the present invention are shown in FIGS. 1 to 4, respectively. Further, a microstructure photograph of a sintered body of Evaluation No. 27 of Comparative Example is shown in FIG. 5. It was confirmed that the sintered bodies obtained by the producing method of the present invention had a fine and sound structure without a large pore as shown in FIGS. 1 to 4. On the other hand, in the sintered body of Evaluation No. 27 which was made up solely of the Mo powder B of a large diameter particle of Comparative Example, the presence of a harmful large pore was confirmed as shown in FIG. 5.

Experimental Example 2

A commercially available Mo powder having a purity of 3N, which is produced by reducing chemically refined Mo oxide (MoO₃) powder, was purchased, and the powder was subjected to disintegration processing to obtain Mo powder A having an average particle diameter of 9 μm.

Next, a Mo bulk body having a density of 7.15×10³ (kg/m³) was cut out to obtain machining chips, and the machining chips were crushed into powder. Then, reduction treatment of the powder surface was carried out by heat treatment, in which the powder was held at a temperature of 1200° C. for 2 hours in a hydrogen gas stream, to obtain Mo powder B in which the average particle diameter was adjusted to be 195 μm.

Tap densities of the obtained sole bodies of the Mo powder A and the Mo powder B, and the mixture of the Mo

TABLE 5

| Evaluation No. | Average particle diameter of powder A (μm) | Average particle diameter of powder B (μm) | Mixing ratio (%) | Tap density × 10³ (kg/m³) |
|---|---|---|---|---|
| 31 | 9 | 195 | 100 | 4.76 |
| 32 | 9 | 195 | 60 | 5.24 |
| 33 | — | 195 | 0 | 3.71 |

As shown in Table 5, it is seen that even in the case of the Mo powder B obtained from a Mo bulk body having a density of 6.64×10³ (kg/m³) which was lower than 10.16× 10³ (kg/m³) of Experimental Example 1, the packing density was drastically improved compared with the cases where the Mo powder A or the Mo powder B was solely packed, by controlling the average particle diameter and adjusting the mixing ratio between the Mo powder A and the Mo powder B.

The invention claimed is:

1. A method for producing a molybdenum target, comprising
preparing mixed powder by mixing molybdenum powder A and a molybdenum powder B, wherein the molybdenum powder A is obtained by reducing and then disintegrating molybdenum oxide so as to adjust the average particle diameter of the molybdenum powder A to be 2 to 15 μm and adjust the amount of oxygen in the molybdenum powder A to be 100 to 900 ppm by mass, and the molybdenum powder B is obtained by crushing a molybdenum bulk body having a density of not less than 6.64×10³ kg/m³ as a raw material so that the average particle diameter of the molybdenum powder B is 50 to 500 μm and then performing reduction-treatment so as to adjust the amount of oxygen in the molybdenum powder B to be 50 to 300 ppm by mass, and wherein the amount of oxygen in the mixed powder is adjusted to be 322 to 410 ppm by mass;
packing the mixed powder in a pressure vessel and then vacuum-degassing the mixed powder while heating the mixed powder; and
pressure-sintering the mixed powder under the condition that a sintering temperature is 1000° C. to 1800° C., a pressure is 10 to 200 MPa and a time is 1 to 10 hours so that the amount of oxygen in a molybdenum sintered body is not more than 300 ppm by mass.

2. The method for producing a molybdenum target according to claim 1, wherein the mixed powder is mixed so that a mass percentage of the molybdenum powder A is 10% to 90%, where the mass percentage is represented by (A/(A+B))×100.

* * * * *